(12) United States Patent
Otsuka et al.

(10) Patent No.: US 11,702,507 B2
(45) Date of Patent: Jul. 18, 2023

(54) RESIN COMPOSITION AND USE THEREOF

(71) Applicant: SHIKOKU CHEMICALS CORPORATION, Kagawa (JP)

(72) Inventors: Akihito Otsuka, Kagawa (JP); Takashi Kashiwabara, Kagawa (JP); Kazunori Aoki, Kagawa (JP); Takeshi Kumano, Kagawa (JP)

(73) Assignee: SHIKOKU CHEMICALS CORPORATION, Kagawa (JP)

( * ) Notice: Subject to any disclaimer, the term of this patent is extended or adjusted under 35 U.S.C. 154(b) by 175 days.

(21) Appl. No.: 17/440,084

(22) PCT Filed: Mar. 26, 2020

(86) PCT No.: PCT/JP2020/013568
§ 371 (c)(1),
(2) Date: Sep. 16, 2021

(87) PCT Pub. No.: WO2020/196718
PCT Pub. Date: Oct. 1, 2020

(65) Prior Publication Data
US 2022/0185960 A1 Jun. 16, 2022

(30) Foreign Application Priority Data
Mar. 28, 2019 (JP) .................. 2019-063110

(51) Int. Cl.
*B32B 3/00* (2006.01)
*C08G 65/48* (2006.01)
(Continued)

(52) U.S. Cl.
CPC .......... *C08G 65/485* (2013.01); *B32B 15/085* (2013.01); *B32B 15/092* (2013.01);
(Continued)

(58) Field of Classification Search
CPC ..... B32B 15/085; B32B 15/092; B32B 27/32; B32B 27/38; C08G 65/485; C08G 65/44
See application file for complete search history.

(56) References Cited

U.S. PATENT DOCUMENTS 4,059,568 A 11/1977 Cooper
4,256,558 A 3/1981 Inata et al.
(Continued)

FOREIGN PATENT DOCUMENTS

JP 2003-160726 A 6/2003
JP 2004-099751 A 4/2004
(Continued)

OTHER PUBLICATIONS

Dwain M. White, The Synthesis of 4-Hydroxyarylene Ethers by the Equilibration of Phenols with Poly (2,6-dimethyl-1,4-phenylene ether), The Journal of Organic Chemistry, Feb. 1969, pp. 297-303, vol. 34, No. 2.

*Primary Examiner* — Elizabeth E Mulvaney
(74) *Attorney, Agent, or Firm* — Paratus Law Group, PLLC

(57) ABSTRACT

This invention provides a material having a low dissipation factor that is suitable for use as an insulating material for a printed wiring board and the like; a resin composition used for the production of the material; and an application using the material. The present invention relates to a resin composition comprising a mono($C_6$-$C_{20}$ alkyl)diallyl isocyanurate and a polyphenylene ether resin; a cured product of the resin composition; and use of the cured product.

18 Claims, 1 Drawing Sheet

(51) Int. Cl.
*C08J 5/24* (2006.01)
*B32B 15/085* (2006.01)
*B32B 15/092* (2006.01)
*B32B 27/32* (2006.01)
*B32B 27/38* (2006.01)
*C08G 65/44* (2006.01)
*C08K 5/3492* (2006.01)
*C09J 171/12* (2006.01)
*H05K 1/03* (2006.01)

(52) U.S. Cl.
CPC .............. *B32B 27/32* (2013.01); *B32B 27/38* (2013.01); *C08G 65/44* (2013.01); *C08J 5/24* (2013.01); *C08J 5/249* (2021.05); *C08K 5/34924* (2013.01); *C09J 171/12* (2013.01); *H05K 1/0346* (2013.01); *B32B 2307/204* (2013.01); *B32B 2307/408* (2013.01); *B32B 2457/08* (2013.01)

(56) References Cited

U.S. PATENT DOCUMENTS

| | | |
|---|---|---|
| 2011/0105687 A1 | 5/2011 | Yamaura |
| 2016/0340546 A1* | 11/2016 | Liao .................... C08G 65/485 |
| 2017/0009061 A1 | 1/2017 | Cai et al. |
| 2019/0367727 A1* | 12/2019 | Liu ...................... H05K 1/0373 |
| 2020/0377676 A1* | 12/2020 | Liu ........................ B32B 29/02 |

FOREIGN PATENT DOCUMENTS

| | | |
|---|---|---|
| JP | 2004-196958 A | 7/2004 |
| JP | 2006-282988 A | 10/2006 |
| JP | 2008-050467 A | 3/2008 |
| JP | 2009-299041 A | 12/2009 |
| JP | 2013-159624 A | 8/2013 |
| JP | 2015-151413 A | 8/2015 |
| JP | 2016-139798 A | 8/2016 |
| JP | 2017-079293 A | 4/2017 |
| JP | 2017-511404 A | 4/2017 |

\* cited by examiner

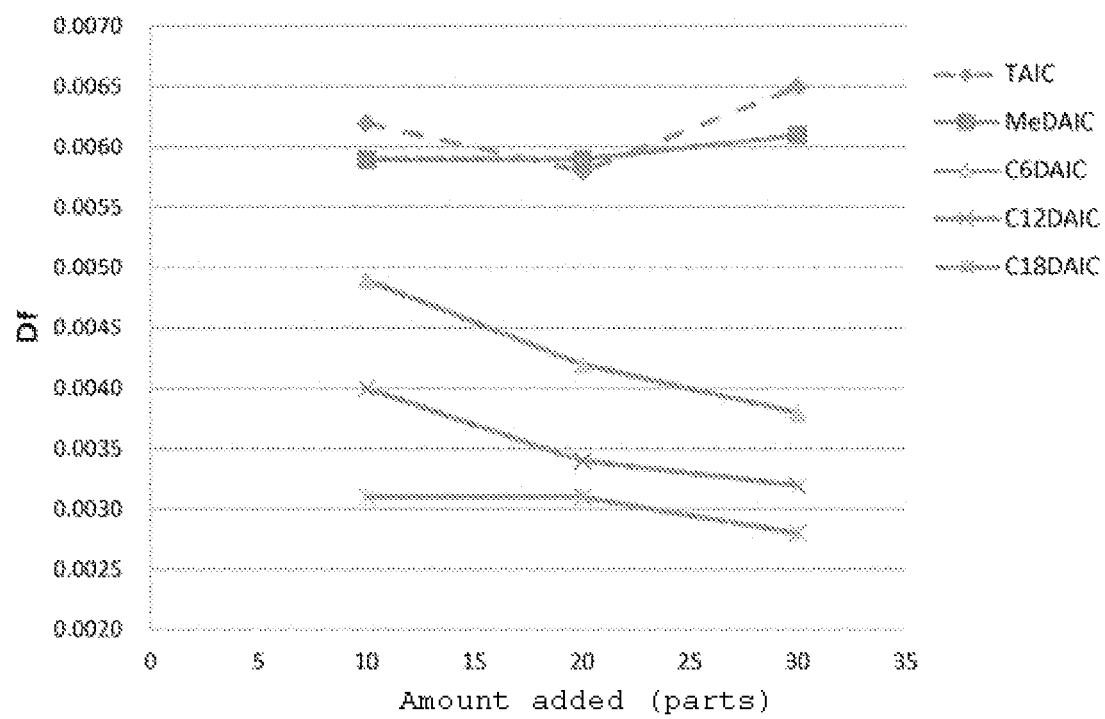

RESIN COMPOSITION AND USE THEREOF

CROSS REFERENCE TO PRIOR APPLICATION

This application is a National Stage Patent Application of PCT International Patent Application No. PCT/JP2020/013568 (filed on Mar. 26, 2020) under 35 U.S.C. § 371, which claims priority to Japanese Patent Application No. 2019-063110 (filed on Mar. 28, 2019), which are all hereby incorporated by reference in their entirety.

TECHNICAL FIELD

The present invention relates to a resin composition comprising a monoalkyl diallyl isocyanurate and a polyphenylene ether resin, and use thereof.

BACKGROUND ART

In recent years, as electronic devices have decreased in size and increased in performance, multiple build-up layers have been formed in multilayer printed wiring boards, requiring miniaturization and high density of wiring. In particular, there is a demand for an insulating material having a low dissipation factor to reduce transmission loss of electrical signals in high-frequency applications.

For example, Patent Literature (PTL) 1 discloses a resin composition comprising a specific polyphenylene ether (PPE) resin and triallyl isocyanurate; a prepreg; a laminate; a printed wiring board; and the like.

PTL 2 discloses a composition comprising a linear aromatic polyester compound and a polyallyl compound. PTL 3 discloses a composition comprising a polyolefin compound and a di- or tri-allyl isocyanurate compound. PTL 4 discloses a composition comprising a polymethylpentene compound and di- or tri-allyl isocyanurate compound.

CITATION LIST

Patent Literature

PTL 1: JP2003-160726A
PTL 2: U.S. Pat. No. 4,256,558
PTL 3: JP2016-139798A
PTL 4: JP2017-079293A

SUMMARY OF INVENTION

Technical Problem

An object of the present invention is to provide a material having a low dissipation factor that is suitable for use as an insulating material for a printed wiring board and the like. Another object of the present invention is to provide a resin composition used for the production of the material, and to provide an application (for example, an insulating material for a printed wiring board and the like) using the material.

Solution to Problem

The present inventors conducted extensive research to achieve the above objects; and, as a result, found that a resin (cured product) obtained by curing a resin composition comprising a polyphenylene ether (which hereinafter may be referred to as "PPE") resin and a specific monoalkyl diallyl isocyanurate has excellent dielectric properties (low relative permittivity and low dissipation factor). The inventors also found that the cured product has excellent water absorption resistance and excellent adhesion to metals. Furthermore, the inventors found that the cured product is useful as an insulating material for a printed wiring board and the like. The inventors conducted further research based on these findings, and accomplished the present invention.

Specifically, the present invention provides the following resin composition and use thereof.

Item 1. A resin composition comprising a compound represented by formula (I) (which hereinafter may be referred to as a "mono($C_6$-$C_{20}$ alkyl)diallyl isocyanurate") and a polyphenylene ether resin:

$$\text{(I)}$$

wherein $R^B$ represents $C_6$-$C_{20}$ alkyl,

Item 2. The resin composition according to Item 1, wherein the polyphenylene ether resin is a compound having a structure represented by formula (1):

$$\text{(1)}$$

wherein each $R^A$ is the same or different and represents hydrogen, $C_1$-$C_6$ alkyl, or $C_2$-$C_6$ alkenyl; and n represents the number of repeating units.

Item 3. The resin composition according to Item 1 or 2, wherein the polyphenylene ether resin is a compound represented by formula (II):

$$\text{(II)}$$

wherein each X is the same or different and represents hydrogen or a group represented by formula (3):

$$\text{(3)}$$

wherein $R^1$, $R^2$, and $R^3$ are the same or different and each represents hydrogen or $C_1$-$C_3$ alkyl; and each Z is the same or different and represents $C_1$-$C_3$ alkylene, —C(=O)—, or -Ph-CH$_2$—; Y is —O— or a group represented by formula (4):

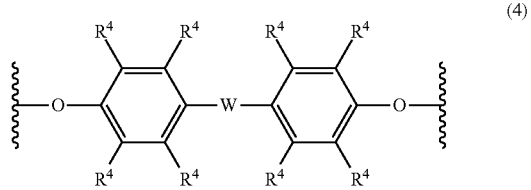

(4)

wherein each $R^4$ is the same or different and represents hydrogen, $C_1$-$C_6$ alkyl, $C_2$-$C_6$ alkenyl, or aryl; and W represents $C_1$-$C_6$ alkylene optionally substituted with phenyl, cycloalkylene, $C_2$-$C_6$ alkenediyl optionally substituted with halogen, —C(=O)—, —S(O)$_m$— (where m represents 0, 1, or 2), or -(alkylene)-(phenylene)-(alkylene)-;

each $R^A$ is the same or different and is as defined above; and each n is the same or different and is as defined above.

Item 4. The resin composition according to any one of Items 1 to 3, wherein the polyphenylene ether resin is a compound represented by formula (IIa):

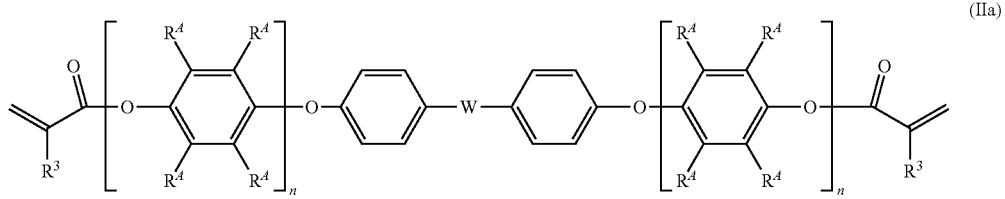

(IIa)

wherein the symbols are as defined above.

Item 5. The resin composition according to any one of Items 1 to 4, wherein the polyphenylene ether resin has a weight average molecular weight (Mw) of 1000 to 120000.

Item 6. A prepreg comprising the resin composition according to any one of Items 1 to 5 and a substrate.

Item 7. A laminate comprising a plurality of the prepregs according to Item 6 that are laminated.

Item 8. A metal-clad laminate comprising the prepreg according to Item 6 or the laminate according to Item 7, and a metallic foil on a surface of the prepreg or the laminate.

Item 9. An adhesive comprising the resin composition according to any one of Items 1 to 5.

Item 10. A cured product of the prepreg according to Item 6, the laminate according to Item 7, the metal-clad laminate according to Item 8, or the adhesive according to Item 9.

Item 11. A printed wiring board comprising the cured product according to Item 10.

Item 12. The printed wiring board according to Item 11, further comprising a circuit (a conductive pattern) on a surface thereof.

Advantageous Effects of Invention

The resin composition of the present invention comprises a polyphenylene ether resin and a mono($C_6$-$C_{20}$ alkyl)diallyl isocyanurate. A cured product obtained by curing the resin composition has a lower relative permittivity and a lower dissipation factor than a cured product of a conventional resin composition comprising a polyphenylene ether resin and a triallyl isocyanurate (for example, see PTL 1). Moreover, the cured product of the resin composition of the present invention has excellent water absorption resistance and excellent adhesion to materials such as metals. Thus, the cured product is suitable as an insulating material for a printed wiring board and the like.

BRIEF DESCRIPTION OF DRAWINGS

FIG. 1 is a graph showing the dielectric properties (dissipation factor) of the cured products obtained in Examples 1 to 9 and Comparative Examples 1 to 6.

DESCRIPTION OF EMBODIMENTS

Typical embodiments of the present invention are described in detail below.

1. Resin Composition

The resin composition of the present invention comprises a mono($C_6$-$C_{20}$ alkyl)diallyl isocyanurate as a crosslinking agent, and a polyphenylene ether resin as a resin.

The mono($C_6$-$C_{20}$ alkyl)diallyl isocyanurate, which is a crosslinking agent, is a compound represented by formula (I):

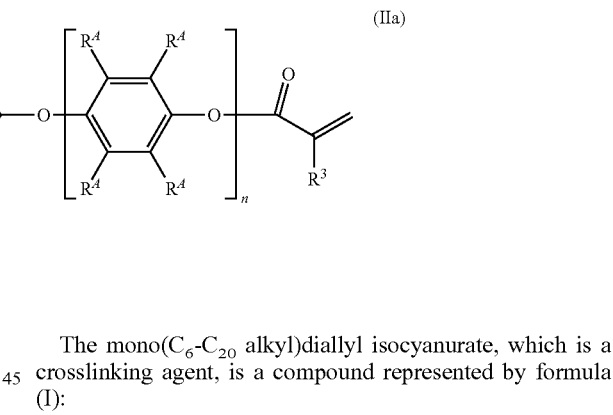

(I)

wherein $R^B$ represents $C_6$-$C_{20}$ alkyl.

The $C_6$-$C_{20}$ alkyl group represented by $R^B$ is preferably $C_6$-$C_{18}$ alkyl, and more preferably $C_8$-$C_{15}$ alkyl. The $C_6$-$C_{20}$ alkyl group may be linear or branched, preferably linear. Specific examples include hexyl, heptyl, octyl, nonyl, decyl, undecyl, dodecyl, tridecyl, tetradecyl, pentadecyl, hexadecyl, heptadecyl, octadecyl, nonadecyl, and icosyl, all of which are preferably linear. Of these, n-hexyl, n-dodecyl, n-octadecyl, and the like are more preferable.

The polyphenylene ether resin is, for example, a compound having a structure represented by formula (1):

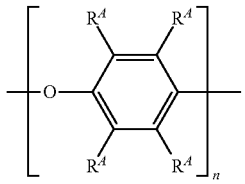
(1)

wherein each $R^A$ is the same or different and represents hydrogen, $C_1$-$C_6$ alkyl, or $C_2$-$C_6$ alkenyl; and n represents the number of repeating units, and is usually an integer of 1 or more.

Examples of the $C_1$-$C_6$ alkyl group represented by $R^A$ include linear or branched $C_1$-$C_6$ alkyl groups. Specific examples include methyl, ethyl, n-propyl, isopropyl, n-butyl, t-butyl, n-pentyl, n-hexyl, and the like. Of these, methyl is preferable.

Examples of the $C_2$-$C_6$ alkenyl group represented by $R^A$ include linear or branched $C_2$-$C_6$ alkenyl groups. Specific examples include vinyl, allyl, isopropenyl, 1-butenyl, 2-butenyl, 3-butenyl, 1-pentenyl, 1-hexenyl, and the like.

Each $R^A$ is the same or different, and is preferably hydrogen or methyl.

n is preferably 1 to 400.

Examples of an embodiment of the compound having a structure represented by formula (1) include a compound having a structure represented by formula (2):

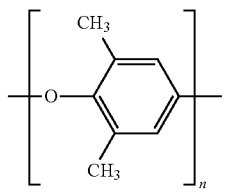
(2)

wherein n is as defined above;
a compound having a structure represented by formula (2'):

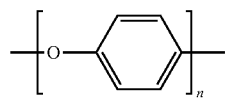
(2')

wherein n is as defined above;
and the like.

The compound having a structure represented by formula (1) preferably has two or more structures irepresented by formula (1) in the molecule. Further, the compound preferably has a crosslinkable group (e.g., a group having a carbon-carbon double bond, such as (meth)acryl, allyl, or vinylbenzyl). The crosslinkable group is preferably present at one or both terminals of the molecule of the compound.

A preferred embodiment of the compound having a structure represented by formula (1) is, for example, a compound represented by formula (II):

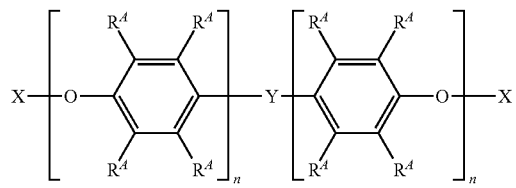
(II)

wherein each X is the same or different and is hydrogen or a group represented by formula (3):

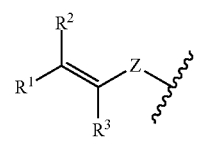
(3)

wherein $R^1$, $R^2$, and $R^3$ are the same or different and each represents hydrogen or $C_1$-$C_3$ alkyl; and each Z is the same or different and represents $C_1$-$C_3$ alkylene, —C(=O)—, or -Ph-CH$_2$—; Y is —O— or a group represented by formula (4):

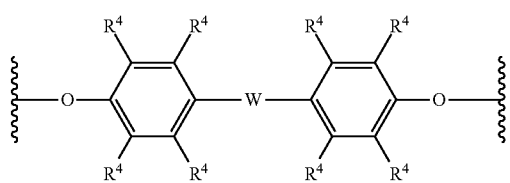
(4)

wherein each $R^4$ is the same or different and represents hydrogen, $C_1$-$C_6$ alkyl, $C_2$-$C_6$ alkenyl, or aryl; and W represents $C_1$-$C_6$ alkylene optionally substituted with phenyl, cycloalkylene, $C_2$-$C_6$ alkenediyl optionally substituted with halogen, —C(=O)—, —S(O)$_m$— (where m represents 0, 1, or 2), or -(alkylene)-(phenylene)-(alkylene)-;
each $R^A$ is the same or different and is as defined above; and each n is the same or different and is as defined above.

Examples of the $C_1$-$C_3$ alkyl groups represented by $R^1$, $R^2$, and $R^3$ include methyl, ethyl, n-propyl, and isopropyl. $R^1$ and $R^2$ are preferably hydrogen, and $R^3$ is preferably hydrogen or methyl.

Examples of the $C_1$-$C_3$ alkylene group represented by Z include methylene, methylmethylene, dimethylene, trimethylene, ethylmethylene, and dimetbylmethylene.

Z is preferably —C(=O)— or -Ph-CH$_2$—.

Examples of the $C_1$-$C_6$ alkyl group represented by $R^4$ include linear or branched $C_1$-$C_6$ alkyl groups. Specific examples include methyl, ethyl, n-propyl, isopropyl, n-butyl, t-butyl, n-pentyl, n-hexyl, and the like.

Examples of the $C_2$-$C_6$ alkenyl group represented by $R^4$ include linear or branched $C_2$-$C_6$ alkenyl groups. Specific examples include vinyl, allyl, isopropenyl, 1-butenyl, 2-butenyl, 3-butenyl, 1-pentenyl, 1-hexenyl, and the like.

Examples of the aryl group represented by $R^4$ include phenyl, toluyl, and the like.

$R^4$ is preferably hydrogen.

Examples of the $C_1$-$C_6$ alkylene group optionally substituted with phenyl represented by W include methylene, methylmethylene, dimethylmethylene, phenylmethylene, phenylmethylmethylene, diphenylmethylene, and the like.

Examples of the cycloalkylene group represented by W include cyclohexane-1,1-diyl and the like.

Examples of the $C_2$-$C_6$ alkenediyl group optionally substituted with halogen represented by W include ethylene-1,1-diyl, 2,2-dichloroethylene-1,1-diyl, and the like.

Examples of -(alkylene)-(phenylene)-(alkylene)- represented by W include —($C_1$-$C_3$ alkylene)-(phenylene)-($C_1$-$C_3$ alkylene)-, and the like. The $C_1$-$C_3$ alkylene group can be arbitrarily selected from among the $C_1$-$C_3$ alkylene groups represented by Z described above. The $C_1$-$C_3$ alkylene group is preferably dimethylmethylene. The phenylene group is, for example, 1,2-phenylene, 1,3-phenylene, or 1,4-phenylene; and is preferably 1,4-phenylene.

W is preferably $C_1$-$C_6$ alkylene, and more preferably $C_1$-$C_3$ alkylene (in particular, dimethylmethylene).

Y is preferably a group represented by formula (4), wherein $R^4$ represents hydrogen; and W represents $C_1$-$C_3$ alkylene.

A preferred example of the compound represented by formula (II) is a compound represented by formula (IIa):

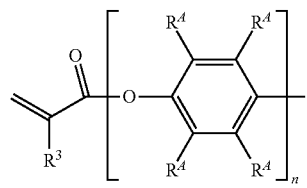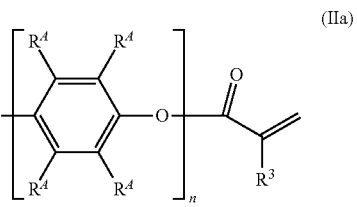

(IIa)

wherein the symbols are as defined above.

The polyphenylene ether resin described above can be produced by or based on a known method described in, for example, U.S. Pat. No. 4,059,568 or the Journal of Organic Chemistry, 34, 297-303 (1969).

The polyphenylene ether resin generally has a weight average molecular weight (Mw) of 1000 to 120000, preferably 1500 to 50000, and even more preferably 2000 to 20000. The molecular weight can be measured by using gel permeation chromatography (GPC) using styrene standards.

The content of the mono($C_6$-$C_{20}$ alkyl)diallyl isocyanurate in the resin composition is generally 10 to 200 parts by mass, preferably 20 to 150 parts by mass, and more preferably 30 to 70 parts by mass, per 100 parts by mass of the polyphenylene ether resin. Alternatively, in another embodiment, the content of the mono($C_6$-$C_{20}$ alkyl)diallyl isocyanurate is generally 20 to 200 parts by mass, preferably 30 to 180 parts by mass, more preferably 40 to 160 parts by mass, and particularly preferably 50 to 150 parts by mass, per 100 parts by mass of the polyphenylene ether resin.

The resin composition may further comprise one or more other crosslinking agents (excluding mono($C_6$-$C_{20}$ alkyl) diallyl isocyanurates) as necessary, as long as the effects of the resin composition can be exhibited. The content of the one or more other crosslinking agents is generally 80 mass % or less, and preferably 40 mass % or less of the total mass of the crosslinking agents.

Examples of the other crosslinking agents include triallyl isocyanurate, triallyl cyanurate, diallyl phthalate, diallyl isophthaiate, diallyl terephthalate, triallyl trimellitate, multifunctional styrene compounds, and the like.

Examples of multifunctional styrene compounds include bisvinylphenylmethane, 1,2-bis(m-vinylphenyl)ethane, 1,2-bis(p-vinylphenyl)ethane, 1-(p-vinylphenyl)-2-(m-vinylphenyl)ethane, 1,3-bis(m-vinylphenylethyl)benzene, 1,3-bis(p-vinylphenylethyl)benzene, 1-(p-vinylphenylethyl)-3-(m-vinylphenylethyl)benzene, 1,4-bis(m-vinylphenylethyl) benzene, 1,4-bis(p-vinylphenylethyl)benzene, 1,6-(bisvinylphenyl)hexane, divinylbenzene polymers (oligomers) having one or more vinyl groups in each side chain, and the like.

The resin composition may further comprise one or more other resins (excluding polyphenylene ether resins) as necessary, as long as the effects of the resin composition can be exhibited. The content of the one or more other resins is generally 50 mass % or less, and preferably 20 mass % or less of the total mass or the resins.

Examples of the other resins include bismaleimide resins, bismaleimide-triazine resins, epoxy resins, benzocyclobutene resins, polytetrafluoroethylene resins, acrylic resins, and the like.

The bismaleimide resin is a compound having two maleimide groups in the molecule, and means a bismaleimide compound before curing. Examples of the bismaleimide resin include aliphatic bismaleimide compounds, aromatic bismaleimide compounds, and the like.

Examples of aliphatic bismaleimide compounds include N,N'-(2,2,4-trimethylhexamethylene)bismaleimide, N,N'-decamethylenebismaleimide, N,N'-octamethylenebismaleimide, N,N'-heptamethylenebismaleimide, N,N'-hexamethylenebismaleimide, N,N'-pentamethylenebismaleimide, N,N'-tetramethylenebismaleimide, N,N'-trimethylenebismaleiniide, N,N'-ethylenebismaleimide, N,N'-(oxydimethylene)bismaleimide, 1,13-bismaleimido-4,7,10-trioxatridecane, 1,11-bismaleimido-3,6,9-trioxaundecane, and the like.

Examples of aromatic bismaleimide compounds include N,N'-(4-methyl-1,3-phenylene)bismaleimide, N,N'-(1,3-phenylene)bismaleimide, N,N'-(1,5-phenylene)bismaleimide, N,N'-(1,2-phenylene)bismaleimide, N,N'-(1,5-naphthylene)bismaleimide, N,N'-(4-chloro-1,3-phenylene) bismaleimide, N,N'-(methylenedi-p-phenylene) bismaleimide, N,N'-(4,4'-biphenylene)bismaleimide, N,N'-(sulfonyldi-p-phenylene)bismaleimide, N,N'-(oxydi-p-phenylene)bismaleimide, N,N'-(3,3'-dimethyl-4,4'-biphenylene)bismaleimide, N,N'-(benzylidenedi-p-phenylene)bismaleimide, N,N'-[methylenebis(3-chloro-4-phenylene)]bismaleimide, N,N'-[methylenebis(3-methyl-4-phenylene)]bismaleimide, N,N'-[methylenebis(3-methoxy-4-phenylene)]bismaleimide, N,N'-(thiodi-p-phenylene) bismaleimide, N,N'-3,3'-benzophenonebismaleimide, N,N'-[methylenebis(3-methyl-5-ethyl-4-phenylene)] bismaleimide, N,N'-[tetramethylenebis(oxy-p-phenylene)] bismaleimide, 2,2-bis[4-(4-maleimidophenoxy)phenyl] propane, bis[4-(4-maleimidophenoxy)phenyl]sulfone, 1,4-phenylenebis(4-maleimidophenoxy), bis[3-(4-maieimidophenoxy)phenyl]sulfone, bis[4-(3-maleimidophenoxy)phenyl]ketone, 1,3-phenylenebis(4- maleimidophenoxy), bis[4-(4-maleimidophenylthio)phenyl] ether, and the like. These may be used singly, or in a combination of two or more.

The bismaleimide-triazine resin is not particularly limited, as long as it is obtained by prepolymerizing a maleimide compound and a cyanic acid ester compound as main components. Examples include a resin obtained by melting 2,2-bis(4-cyanatophenyl)propane and bis(3-ethyl-5-methyl-4-maleimidophenyl)methane by heating, and polymerizing them; and a resin obtained by melting a novolac cyanic acid ester resin and bis(3-ethyl-5-methyl-4-maleimidophenyl) methane by heating, and polymerizing them, followed by dissolving in methyl ethyl ketone.

The epoxy resin is a compound having epoxy (such as glycidyl or epoxycyclohexyl) in the molecule, and means an epoxy compound before curing. Examples of the epoxy resin include polygiycidyl ethers (e.g., bisphenol A-type epoxy resins) obtained by reacting a polyhydric phenol, such as bisphenol A, bisphenol F, bisphenol AD, catechol, or resorcinol, or a polyhydric alcohol, such as glycerol or polyethylene glycol, with epichiorohydrin; glycidyi ether esters obtained by reacting a hydroxycarboxylic acid, such as p-hydroxybenzoic acid or β-hydroxynaphthoic acid, with epichiorohydrin; polygiycidyl esters obtained by reacting a polycarboxylic acid, such as phthalic acid or terephthalic acid, with epichiorohydrin; glycidyi glycoluril compounds having two or more epoxy groups in the molecule, such as 1,3,4,6-tetraglycidyl glycoluril; cyclic cycloaliphatic epoxy resins, such as 3',4'-epoxycyclohexylmethyl-3,4-epoxycyclohexanecarboxylate; nitrogen-containing cyclic epoxy resins, such as triglycidyl isocyanurate and hydantoin-type epoxy resins; epoxidized phenol novolac resins (phenol novolac-type epoxy resins); epoxidized cresol novolac resins; epoxidized polyolefins; cyclic aliphatic epoxy resins; urethane-modified epoxy resins; epoxy-modified organopolysilcxane compounds obtained by a hydrosliylation addition reaction of an organic compound having a carbon-carbon double bond and a glycidyi group, and a silicon compound having an SiH group (e.g., the epoxy-modified organopolysiloxane compounds described in JP2004-099751A, JP2006-282988A, and the like); and the like. These may be used singly, or in a combination of two or more.

The benzocyclobutene resin is not particularly limited, as long as two or more benzocyclobutene groups are bonded directly or via an organic group.

The resin composition may comprise other components, such as compatibilizing agents, radical initiators, flame retardants, inorganic fillers, stress relievers, and organic solvents, as necessary.

Examples of compatibilizing agents include styrene-butadiene block copolymers, styrene-isoprene block copolymers, 1,2-polybutadiene, 1,4-polybutadiene, maleic acid- or maleic anhydride-modified poiybutadiene, acrylic-modified polybutadiene, epoxy-modified poiybutadiene, and the like. One or more compatibilizing agents can be selected from the group consisting of these compatibilizing agents. The content of the compatibilizing agent is generally 5 to 100 parts by mass, and preferably 20 to 50 parts by mass, per 100 parts by mass of the polyphenylene ether resin.

The radical initiator is not particularly limited, as long as it is a compound capable of generating radicals in order to crosslink the polyphenylene ether resin with the mono($C_6$-$C_{20}$ alkyl)diallyl isocyanurate. Examples include peroxides (in particular, organic peroxides). Specific examples include di-t-butyl peroxide, 2,5-dimethyl-2,5-di(t-butyl peroxide) hexane, 2,5-dimethyl-2,5-di(t-butyl peroxide)hexyne-3,α, α'-di(t-butylperoxy)diisopropylbenzene, and the like. One or more radical initiators can be selected from the group consisting of these radical initiators. The content of the radical initiator is generally 0.1 to 50 parts by mass, and preferably 1 to 10 parts by mass, per 100 parts by mass of the polyphenylene ether resin.

Examples of flame retardants include, but are not particularly limited to, melamine phosphate, melam polyphosphate, melem polyphosphate, melamine pyrophosphate, ammonium polyphosphate, red phosphorus, aromatic phosphoric acid ester, phosphonic acid ester, phosphinic acid ester, phosphine oxide, phosphazene, melamine cyanurate, ethylenebispentabromobenzene, ethylenebistetrabromophthalimide, and the like. One or more flame retardants can be selected from the group consisting of these flame retardants. The content of the flame retardant is generally 0 to 100 parts by mass, and preferably 1 to 50 parts by mass, per 100 parts by mass of the polyphenylene ether resin.

Examples of inorganic fillers include, but are not particularly limited to, metal oxides, nitrides, silicides, borides, and the like (e.g., silica, boron nitride, wollastonite, talc, kaolin, clay, mica, alumina, zirconia, and titania). One or more inorganic fillers can be selected from the group consisting of these inorganic fillers. In particular, in order to reduce the dielectric constant of the resin composition, it is preferable to use a low-dielectric constant filler, such as silica or boron nitride, as an inorganic filler. Examples of silica include ground silica, fused silica, and the like. The inorganic filler preferably has an average particle size of 5 μm or less. For example, the use of an inorganic filler such as silica particles having an average particle size of 5 μm or less improves adhesion to a metallic foil when the resin composition is used in a metal-clad laminate etc. The content of the inorganic filler is generally 0 to 200 parts by mass, and preferably 5 to 100 parts by mass, per 100 parts by mass of the polyphenylene ether resin.

Examples of stress relievers include, but are not particularly limited to, silicone resin particles and the like. The stress reliever preferably has an average particle size of 10 μm or less. The use of a stress reliever having such an average particle size improves adhesion to a metallic foil when the resin composition is used in a metal-clad laminate etc. The content of the stress reliever is generally 0 to 100 parts by mass, and preferably 0 to 50 parts by mass, per 100 parts by mass of the polyphenylene ether resin.

The organic solvent is not particularly limited, as long as it can dissolve or disperse a resin. Examples include ketone solvents, such as methyl ethyl ketone; ether solvents, such as dibutyl ether; ester solvents, such as ethyl acetate; amide solvents, such as dimethylformamide; aromatic hydrocarbon solvents, such as benzene, toluene, and xylene; chlorinated hydrocarbon solvents, such as trichloroethylene; and the like. One or more organic solvents can be selected from the group consisting of these organic solvents. The resin composition containing an organic solvent can be used for impregnating a substrate with the resin composition as a resin varnish to produce a prepreg, as described later. The content of the organic solvent is adjusted according to the process of applying the resin varnish to a substrate, or impregnating a substrate with the resin varnish. The content of the organic solvent is generally 30 to 1000 parts by mass, and preferably 40 to 500 parts by mass, per 100 parts by mass of the polyphenylene ether resin.

The resin composition may further comprise other additives, such as silane-based coupling agents, depending on the purpose thereof.

2. Prepreg, Adhesive, and Cured Product Thereof, and Use Thereof

The prepreg of the present invention comprises the resin composition and a substrate. Examples of the substrate include woven or non-woven fabrics of fibers (inorganic fibers, such as glass fibers, or organic fibers, such as polyimide fibers), paper, and the like. Examples of the material of the glass fibers include D-glass, S-glass, NE-glass, quartz glass, and the like, in addition to ordinary E-glass. If necessary, a coupling agent, such as a silane-based coupling agent or a titanate-based coupling agent, can be applied to the substrate for use.

The proportion of the substrate in the prepreg is generally 20 to 80 mass %, and preferably 25 to 70 mass %, of the entire prepreg.

The prepreg can be produced, for example, by applying the resin composition (resin varnish in which the resin composition is uniformly dissolved or dispersed in an organic solvent described above, as necessary) to the substrate or impregnating the substrate with the resin composition, followed by drying by heating. Alternatively, the resin composition may be melted, and applied to or impregnated into the substrate.

Examples of the application method and the impregnation method include, but are not particularly limited to, a method of applying a solution or dispersion of the resin composition using a spray, a brush, a bar coater, or the like; a method of immersing the substrate in a solution or dispersion of the resin composition (dipping); and the like. The application or impregnation can be repeated multiple times, as necessary. Alternatively, it is also possible to repeat the application or impregnation using multiple solutions or dispersions having different resin concentrations.

The prepreg is preferably obtained by impregnating the substrate with the resin composition, drying it by heating, and curing (in particular, semi-curing) it.

The resin composition (components) in the prepreg and the content thereof can be analyzed, for example, by gas chromatography-mass spectrometry (GC-MS), nuclear magnetic resonance analysis ($^1$H-NMR and $^{13}$C-NMR), Fourier transform infrared absorption spectrometry (FT-IR), or quantitative analysis of pyrolysis products by pyrolysis gas chromatography.

The present invention provides a laminate formed by laminating a plurality of the prepregs. The resulting prepregs are, for example, subjected to heat-molding to be processed into a laminate. The laminate can be produced, for example, by stacking a plurality of the prepregs, followed by heat-pressure molding. Furthermore, the resulting laminate can be combined with another prepreg to produce a thicker laminate.

The molding and curing reaction of the laminate can be generally performed at the same time using a heat press. Alternatively, a semi-cured laminate may be first obtained by laminate-forming, and then treated with a heat treatment machine to be completely cured. The heat-pressure molding can be performed at 50 to 300° C. (in particular, 80 to 250° C.) under a pressure of 0.1 to 50 MPa (in particular, 0.5 to 10 MPa) for about 1 minute to 10 hours (in particular, about 30 minutes to 5 hours).

The present invention provides a metal-clad laminate. The metal-clad laminate corrprises a metallic foil on the surface of the prepreg or the laminate thereof. The metal-clad laminate can be produced, for example, by stacking the prepreg or the laminate thereof, and a metallic foil, followed by heat-pressure molding.

Examples of metallic foils include, but are not particularly limited to, copper foils, such as electrolytic copper foils and rolled copper foils; aluminum foils; composite foils obtained by stacking these metallic foils; and the like. Of these metallic foils, copper foils are preferable. The thickness of the metallic foil is not particularly limited, and is generally about 5 to 105 µm. The metal-clad laminate can also be obtained by stacking a desired number of the prepregs and a desired number of the metallic foils, followed by heat-pressure molding.

The adhesive of the present invention comprises the resin composition as a component. The adhesive can be used as an adhesive between two materials selected from metals, inorganic materials, and resin materials. In particular, the adhesive is preferable as an adhesive between a metal and a material selected from metals, inorganic materials, and resin materials.

Examples of metals include copper, aluminum, titanium, nickel, tin, iron, silver, gold, and alloys thereof. Of these metals, copper is preferable. The form of the metal includes plates, foils, plating films, etc., of these metals.

Examples of inorganic materials include silicon, ceramics, carbon used as a filler, inorganic salts, glass, and the like. Specific examples include silicon compounds, such as silicon, silicon carbide, silica, glass, diatoraite, calcium silicate, talc, glass beads, sericite activated clay, bentonite, aluminosilicate, and mica; oxides, such as alumina, zinc oxide, iron oxide, magnesium oxide, tin oxide, and titanium oxide; hydroxides, such as magnesium hydroxide, aluminum hydroxide, and basic magnesium carbonate; carbonates, such as calcium carbonate, zinc carbonate, hydrotalcite, and magnesium carbonate; sulfates, such as barium sulfate and gypsum; titanates, such as barium titanate; nitrides, such as aluminum nitride and silicon nitride; graphites, such as flake graphite (natural graphite), expandable graphite, and expanded graphite (synthetic graphite); activated carbon; carbon fibers; carbon black; and the like.

Of these inorganic material, silicon, ceramics (e.g., alumina, silicon carbide, aluminum nitride, silicon nitride, and barium titanate), glass, and inorganic salts are preferable.

Examples of resin materials include nylon, acrylate resins, epoxy resins, olefin resins, benzoxazine resins, polybenzoxazole resins, silicone resins, polyamide resins, polyamide resins, bismaleimide resins, maleimide resins, cyanate resins, polyphenylene ether resins, polyphenylene oxide resins, fluorine-containing resins, polyether resins, polyetherimide resins, polyetheretherketone resins, polyester resins, silicone resins, liquid crystal resins, and the like. These may be used in combination by mixing them or modifying them with each other.

Of these resin materials, acrylate resins, epoxy resins, olefin resins, benzoxazine resins, polybenzoxazole resins, bismaleimide resins, polyphenylene ether resins, fluorine-containing resins, polyether resins, liquid crystal resins, silicone resins, and polyimide resins are preferable.

Materials may be bonded using the adhesive by a known method. Specific examples of the method include (1) a method comprising applying the adhesive to the surface of a material selected from metals, inorganic materials, and resin materials, pressure-bonding another material to a part or the entirety of the adhesive applied, and bonding the materials by curing the adhesive; and (2) a method comprising attaching a sheet of the semi-cured adhesive to the surface of a material selected from metals, inorganic materials, and resin materials, pressure-bonding another material to a part or the entirety of the other side of the adhesive, and bonding the materials by curing the adhesive.

The adhesive may be cured by a known method. Examples of the method include a method comprising applying heat and pressure using a heat press; a method comprising performing a heat treatment after drying the adhesive applied; and the like. The application of heat and pressure is preferably performed in the conditions of 50 to 300° C. (in particular, 80 to 250° C.) under a pressure of 0.1 to 50 MPa (in particular, 0.5 to 10 MPa) for about 1 minute to 10 hours (in particular, about 30 minutes to 5 hours).

Since two materials, in particular, two different kinds of materials, can be bonded by using the adhesive of the present invention, as described above, the adhesive of the present invention can be suitably used for electronic devices, such as various electric or electronic components, semiconductor wafers, printed wiring boards, and flexible metal-clad laminates.

The present invention provides a printed wiring board. The printed wiring board comprises a plurality of insulating layers and one or more conductive layers individually disposed between the insulating layers, wherein each insulating layer is formed from a cured product obtained from the resin composition described above; and a substrate.

The printed wiring board is obtained, for example, by stacking an inner layer plate in which a circuit (a conductive pattern) and through holes are formed in a metal-clad laminate, and a prepreg; and then laminating a metallic foil on the surface of the prepreg, followed by heat-pressure molding. Further, a circuit (a conductive pattern) and through holes may be formed on the conductive metallic foil on the surface to make a multilayer printed wiring board.

According to the resin composition of the present invention, a cured product having a low relative permittivity and a low dissipation factor can be obtained. Further, it is also possible to obtain a cured product having excellent water absorption resistance and excellent adhesion to a material such as metals. The use of the resin composition makes it possible to obtain a prepreg, metal-clad laminate, and adhesive that are excellent in water absorption resistance, and that have a low relative permittivity and a low dissipation factor; as well as obtain a printed wiring board having excellent high-frequency characteristics.

In the present specification, the term "comprise" or "have" also includes the concepts of "consist essentially of" and "consist of."

EXAMPLES

Examples are given below to illustrate the present invention in more detail; however, the present invention is not limited to these Examples. In the Examples, "parts" indicates "parts by mass," unless otherwise specified.

Starting Compounds and Reagents

The starting compounds and reagents used in the Examples and Comparative Examples are listed below.

Crosslinking Agents (Isocyanurates)

(1) Among the isocyanurates shown in Table 1, the TAIC and MeDAIC used are as follows.
TAIC: triallyl isocyanurate (produced by Tokyo Chemical Industry Co., Ltd.)
MeDAIC: monomethyl diallyl isocyanurate (produced by Shikoku Chemicals Corporation)
(2) Among the isocyanurates shown in Table 1, C6DAIC, C12DAIC, and C18DAIC were synthesized from diallyl isocyanurate and the corresponding alkyl chloride (R—Cl) according to known documents (e.g., WO2015/149222 and JP2015-151413A).

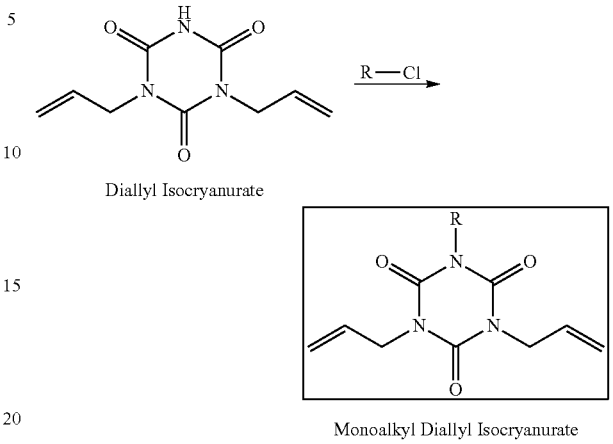

Diallyl Isocyanurate

Monoalkyl Diallyl Isocyanurate

TABLE 1

| Structure of R | Abbreviation |
| --- | --- |
| ⟶ | TAIC |
| CH₃— | MeDAIC |
| n-C₆H₁₃— | C6DAIC |
| n-C₁₂H₂₅— | C12DAIC |
| n-C₁₈H₃₇— | C18DAIC |

PPE Resin
SA9000-111: methacrylic-modified polyphenylene ether (molecular weight: 2300) (produced by SABIC)
Compatibilizing Agent
Tufprene A: styrene-butadiene block copolymer (styrene/butadiene weight ratio=40/60) (produced by Asahi Kasei Corporation)
Radical Initiator
Perbutyl P: α,α'-di(t-butylperoxy)diisopropylbenzene (produced by NOF Corporation)
Organic Solvent
Toluene (produced by Fujifilm Wako Pure Chemical Corporation)

Examples 1 to 9 and Comparative Examples 1 to 6

(1) Production of Cured Product
Resin compositions having the formulations shown in Table 2 were each prepared. Each resin composition was individually poured into a mold made by placing a 2-mm-thick U-shaped silicone rubber between two glass plates, and then placed in a blower oven heated to 70° C. to evaporate toluene until a constant weight was achieved. Thereafter, a heat treatment was performed at 120° C. for 0.5 h, at 150° C. for 0.5 h, and at 190° C. for 1 h, thereby producing cured products.

(2) Evaluation of Dielectric Properties

The dielectric properties of the cured products produced in Item (1) above were measured using a network analyzer (produced by Agilent Technologies; E8361A) at a measurement frequency (10 GHz) by a cavity resonance method. Table 2 and FIG. 1 show the results.

TABLE 2

| | | Comp. Ex 1 | Comp. Ex 2 | Comp. Ex 3 | Comp. Ex 4 | Comp. Ex. 5 | Comp. Ex 6 | Ex 1 | Ex 2 | Ex 3 |
|---|---|---|---|---|---|---|---|---|---|---|
| Crosslinking agent Formulation | Crosslinking agent | TAIC | | | MeDAIC | | | C6DAIC | | |
| | Crosslinking agent (parts) | 10 | 20 | 30 | 10 | 20 | 30 | 10 | 20 | 30 |
| | PPE resin (parts) | 22.4 | 22.4 | 22.4 | 22.4 | 22.4 | 22.4 | 22.4 | 22.4 | 22.4 |
| | Compatibilizing agent (parts) | 7.6 | 7.6 | 7.6 | 7.6 | 7.6 | 7.6 | 7.6 | 7.6 | 7.6 |
| | Radical initiator (parts) | 1.2 | 1.2 | 1.2 | 1.2 | 1.2 | 1.3 | 1.2 | 1.2 | 1.2 |
| | Organic solvent (parts) | 50 | 50 | 50 | 50 | 50 | 50 | 50 | 50 | 50 |
| Dielectric Properties (10 GHz) | Relative permittivity | 2.5 | 2.5 | 2.5 | 2.5 | 2.5 | 2.5 | 2.5 | 2.5 | 2.5 |
| | Dissipation factor | 0.0062 | 0.0058 | 0.0065 | 0.0059 | 0.0059 | 0.0061 | 0.0049 | 0.0042 | 0.0038 |

| | | Ex 4 | Ex 5 | Ex 6 | Ex 7 | Ex 8 | Ex 9 |
|---|---|---|---|---|---|---|---|
| Crosslinking agent Formulation | Crosslinking agent | C12DAIC | | | C18DAIC | | |
| | Crosslinking agent (parts) | 10 | 20 | 30 | 10 | 20 | 30 |
| | PPE resin (parts) | 22.4 | 22.4 | 22.4 | 22.4 | 22.4 | 22.4 |
| | Compatibilizing agent (parts) | 7.6 | 7.6 | 7.6 | 7.6 | 7.6 | 7.6 |
| | Radical initiator (parts) | 1.2 | 1.2 | 1.2 | 1.2 | 1.2 | 1.3 |
| | Organic solvent (parts) | 50 | 50 | 50 | 50 | 50 | 50 |
| Dielectric Properties (10 GHz) | Relative permittivity | 2.4 | 2.4 | 2.4 | 2.4 | 2.4 | 2.4 |
| | Dissipation factor | 0.0040 | 0.0034 | 0.0032 | 0.0031 | 0.0031 | 0.0028 |

Example 10 and Comparative Example 7

(1) Production of Cured Product

Resin compositions having the formulations shown in Table 3 were each prepared. Each resin composition was individually poured into a mold made by placing a 2-mm-thick U-shaped silicone rubber between two glass plates, and then placed in a blower oven heated to 70° C. to evaporate toluene until a constant weight was achieved. Thereafter, a heat treatment was performed at 120° C. for 0.5 h, at 150° C. for 0.5 h, and at 190° C. for 1 h, thereby producing cured products.

(2) Evaluation of Water Absorption Resistance

The cured products produced in Item (1) above were each cut to 50×50 mm and immersed into ion-exchanged water at 25° C. for 24 hours, and the water absorption (%) was calculated from the mass change before and after immersion. Table 3 shows the results.

Water absorption (%)=(mass before immersion−mass after immersion)/mass before immersion×100

TABLE 3

| | | Comparative Example 2 | Example 10 |
|---|---|---|---|
| Formulation | Crosslinking agent | TAIC | C12DAIC |
| | Crosslinking agent (parts) | 20 | 20 |
| | PPE resin (parts) | 22.4 | 22.4 |
| | Compatibilizing agent (parts) | 7.6 | 7.6 |
| | Radical initiator (parts) | 1.2 | 1.2 |
| | Organic solvent (parts) | 50 | 50 |
| Water absorption | Water absorption (%) | 0.43 | 0.16 |

Example 11 and Comparative Example 8

(1) Production of Test Piece

Resin compositions having the formulations shown in Table 4 were each prepared. Each resin composition was then individually applied to the matte surface of a 10×10 cm electrolytic copper foil (thickness: 18 μm) so that the thickness after drying was 25 μm; and subjected to a drying treatment at 25° C. for 30 min, at 80° C. for 50 min, and 120° C. for 40 min. Thereafter, a glass epoxy substrate (FR-4 grade) was stacked on the matte surface; followed by pressing under heat and pressure conditions of 200° C. and 3 MPa for 1 h, thereby producing test pieces.

(2) Evaluation of Adhesion

The normal peel strength of the test pieces produced in Item (1) above was measured in accordance with "JIS C6481." Table 4 shows the results.

TABLE 4

| | | Comparative Example 8 | Example 11 |
|---|---|---|---|
| | Crosslinking agent | TAIC | C12DAIC |
| Formulation | Crosslinking agent (parts) | 20 | 20 |
| | PPE resin (parts) | 22.4 | 22.4 |
| | Compatibilizing agent (parts) | 7.6 | 7.6 |
| | Radical initiator (parts) | 1.2 | 1.2 |
| | Organic solvent (parts) | 50 | 50 |
| Adhesion | Peel strength (N/cm) | 5.4 | 7.2 |

The results in Tables 2 to 4 show that a cured product having low dielectric properties (low dissipation factor) and excellent water absorption resistance is obtained by using a monoalkyl diallyl isocyanurate containing an alkyl chain having six or more carbon atoms as a crosslinking agent for PPE resins.

The invention claimed is:

1. A resin composition comprising a compound represented by formula (I) and a polyphenylene ether resin:

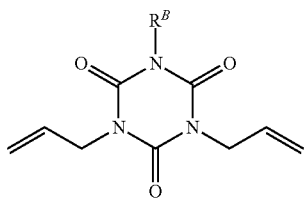

(I)

wherein $R^B$ represents $C_6$-$C_{20}$ alkyl.

2. The resin composition according to claim 1, wherein the polyphenylene ether resin is a compound comprising a structure represented by formula (1):

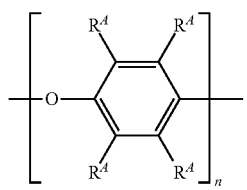

(1)

wherein each $R^A$ is the same or different and represents hydrogen, $C_1$-$C_6$ alkyl, or $C_2$-$C_6$ alkenyl; and n represents the number of repeating units.

3. The resin composition according to claim 2, wherein the polyphenylene ether resin is a compound represented by formula (II):

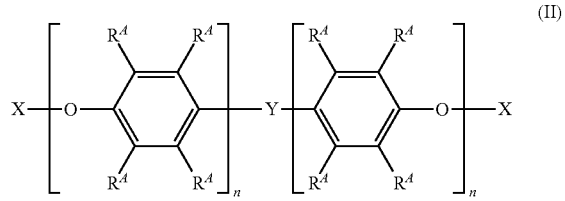

(II)

wherein each X is the same or different and represents hydrogen or a group represented by formula (3):

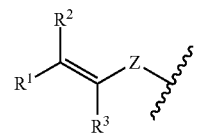

(3)

wherein $R^1$, $R^2$, and $R^3$ are the same or different and each represents hydrogen or $C_1$-$C_3$ alkyl; and each Z is the same or different and represents $C_1$-$C_3$ alkylene, —C(=O)—, or -Ph-CH$_2$—;

Y is —O— or a group represented by formula (4):

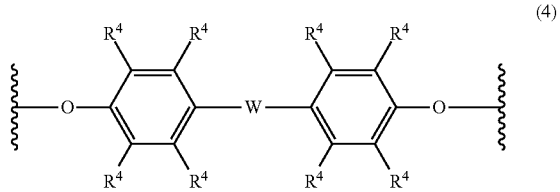

(4)

wherein each $R^4$ is the same or different and represents hydrogen, $C_1$-$C_6$ alkyl, $C_2$-$C_6$ alkenyl, or aryl; and W represents $C_1$-$C_6$ alkylene optionally substituted with phenyl, cycloalkylene, $C_2$-$C_6$ alkenediyl optionally substituted with halogen, —C(=O)—, —S(O)$_m$— (where m represents 0, 1, or 2), or -(alkylene)-(phenylene)-(alkylene)-;

each $R^A$ is the same or different and is as defined above; and each n is the same or different and is as defined above.

4. The resin composition according to claim 3, wherein the polyphenylene ether resin is a compound represented by formula (IIa):

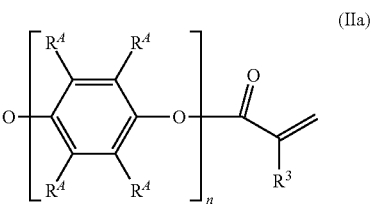

(IIa)

wherein the symbols in formula (IIa) as defined above.

5. The resin composition according to claim 2, wherein the polyphenylene ether resin has a weight average molecular weight (Mw) of 1000 to 120000.

6. A prepreg comprising the resin composition according to claim 2.

7. A laminate comprising a plurality of the prepregs according to claim 6 laminated together.

8. A metal-clad laminate comprising the prepreg according to claim 6, and a metallic foil on a surface of the prepreg.

9. An adhesive comprising the resin composition according to claim 2.

10. A product obtained by curing the prepreg according to claim 6.

11. A printed wiring board comprising the cured product according to claim 10.

12. The printed wiring board according to claim 11, further comprising a circuit on a surface thereof.

13. A metal-clad laminate comprising the laminate according to claim 7, and a metallic foil on a surface of the laminate.

14. The resin composition according to claim 3, wherein the polyphenylene ether resin has a weight average molecular weight (Mw) of 1000 to 120000.

15. The resin composition according to claim 4, wherein the polyphenylene ether resin has a weight average molecular weight (Mw) of 1000 to 120000.

16. A product obtained by curing the laminate according to claim 7.

17. A product obtained by curing the metal-clad laminate according to claim 8.

18. A product obtained by curing the adhesive according to claim 9.

* * * * *